United States Patent
McCombs

(10) Patent No.: US 10,199,090 B2
(45) Date of Patent: Feb. 5, 2019

(54) LOW ACTIVE POWER WRITE DRIVER WITH REDUCED-POWER BOOST CIRCUIT

(71) Applicant: Apple Inc., Cupertino, CA (US)

(72) Inventor: Edward M. McCombs, Austin, TX (US)

(73) Assignee: Apple Inc., Cupertino, CA (US)

(*) Notice: Subject to any disclaimer, the term of this patent is extended or adjusted under 35 U.S.C. 154(b) by 185 days.

(21) Appl. No.: 15/271,516

(22) Filed: Sep. 21, 2016

(65) Prior Publication Data

US 2018/0082735 A1    Mar. 22, 2018

(51) Int. Cl.
| G06F 12/0875 | (2016.01) |
| G11C 8/00 | (2006.01) |
| G11C 11/4096 | (2006.01) |
| G11C 11/4091 | (2006.01) |
| G11C 11/408 | (2006.01) |

(52) U.S. Cl.
CPC ...... *G11C 11/4096* (2013.01); *G06F 12/0875* (2013.01); *G11C 11/4085* (2013.01); *G11C 11/4091* (2013.01); *G06F 2212/1028* (2013.01); *G06F 2212/452* (2013.01)

(58) Field of Classification Search
CPC ............ G11C 11/4096; G11C 11/4085; G11C 11/4091; G06F 12/0875; G06F 2212/1028; G06F 2212/452
USPC ................................................. 365/189.09
See application file for complete search history.

(56) References Cited

U.S. PATENT DOCUMENTS

| 6,333,873 B1 * | 12/2001 | Kumanoya | ............ G11C 5/145 |
| | | | 365/149 |
| 7,800,959 B2 | 9/2010 | Childs et al. | |
| 8,233,342 B2 | 7/2012 | Adams et al. | |
| 9,177,633 B2 | 11/2015 | Roy et al. | |
| 2007/0268769 A1 * | 11/2007 | Okuyama | ............ G11C 5/143 |
| | | | 365/227 |

* cited by examiner

*Primary Examiner* — Ly D Pham
(74) *Attorney, Agent, or Firm* — Anthony M. Petro; Meyertons, Hood, Kivlin, Kowert & Goetzel, P.C.

(57) ABSTRACT

Techniques for implementing a storage array write driver with a reduced-power boost circuit. An apparatus may include a bit cell configured to store data, a bit line circuit coupled to convey data to the bit cell, a write driver circuit configured to transmit write data to the bit cell via the bit line circuit, and a boost circuit that is distinct from the write driver circuit. The boost circuit may be selectively coupled to drive the bit line circuit below a ground voltage dependent on activation of a boost signal and the write data being in a logic low state. The boost circuit may also be coupled to the bit line circuit at a location that is closer to the bit cell than to the write driver circuit, and may be sized to discharge the bit line circuit without being sized to discharge internal capacitance of the write driver.

20 Claims, 8 Drawing Sheets

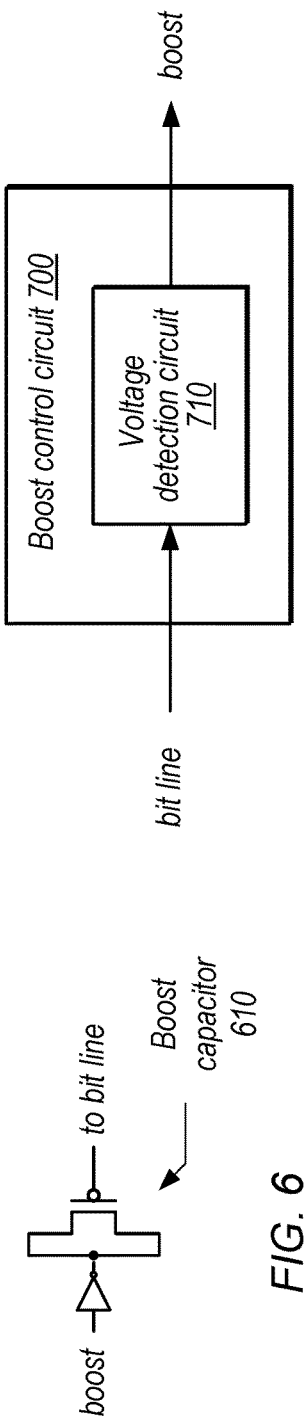
FIG. 6
FIG. 7
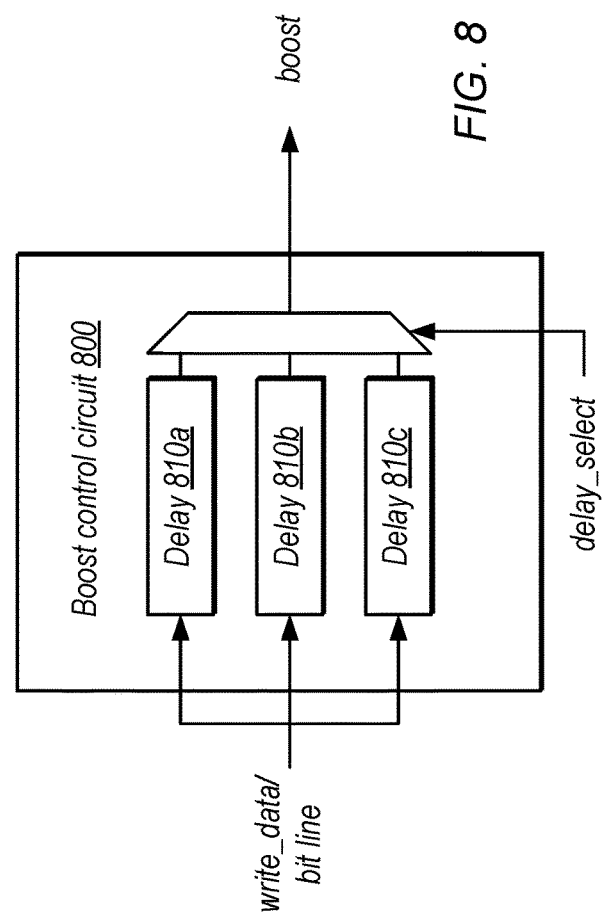
FIG. 8

LOW ACTIVE POWER WRITE DRIVER WITH REDUCED-POWER BOOST CIRCUIT

BACKGROUND

Technical Field

Embodiments described herein relate to the field of processors and more particularly, to techniques for reducing power consumption in memory arrays.

Description of the Related Art

A processor is generally hardware circuitry designed to execute the instructions defined in a particular instruction set architecture implemented by the processor, for the purpose of implementing a wide variety of functionality specified by software developers. To implement a given architecture, processors typically include a variety of types of circuits. For example, a processor may include functional units that are designed to operate on data to produce arithmetic, logical, or other types of results. Functional units and other execution-related processor logic may be implemented using combinational logic gates that implement various Boolean functions, often in combination with state elements such as registers, latches, flip-flops, or the like. A processor may also include storage arrays that are primarily designed to store data rather than process or transform it; storage arrays may be used within processors to implement various types of caches, register files, queues, buffers, or other types of storage structures.

Power requirements tend to substantially influence the cost and performance of a system that employs a particular integrated circuit design. For example, excessive power requirements may in turn require more expensive circuit packaging and cooling. In mobile applications, power consumption directly affects battery life and total device run time. Accordingly, the power requirements of various circuits within an integrated circuit may have far-reaching implications for system cost and performance.

SUMMARY

Systems, apparatuses, and methods for implementing a write driver with a reduced-power boost circuit are contemplated. In various embodiments, an apparatus may include a bit cell configured to store data, a bit line circuit coupled to convey data to the bit cell, a write driver circuit configured to transmit write data to the bit cell via the bit line circuit, and a boost circuit that is distinct from the write driver circuit. The boost circuit may be selectively coupled to drive the bit line circuit below a ground voltage dependent on activation of a boost signal and the write data being in a logic low state. The boost circuit may also be coupled to the bit line circuit at a location that is closer to the bit cell than to the write driver circuit.

In various embodiments, a storage array may include an array of bit cells organized according to a number of rows and columns. For a given column, the storage array may further include a bit line circuit coupled to the bit cells included in the given column, and a write driver circuit configured to couple write data to the bit line circuit. The write data may be qualified to be valid during a period that both a clock signal input to the storage array and a write enable signal input to the storage array are activated. Further, the write driver circuit may be activated to couple the write data to the bit line circuit of the given column dependent upon a boost signal corresponding to the given column being deactivated.

The storage array may further include a boost circuit that is distinct from the write driver circuit, coupled directly to the bit line circuit of the given column without being coupled to discharge internal capacitance of the write driver circuit, and selectively enabled to drive the bit line circuit of the given column below a ground voltage dependent on both activation of the boost signal corresponding to the given column and the write data for the given column being in a logic low state. Moreover, activation of the write driver to couple the write data to the bit line circuit of the given column may be mutually exclusive with activation of the boost circuit to drive the bit line circuit of the given column below the ground voltage. During operation of the storage array, timing of activation of the boost signal relative to the write data may be dynamically variable.

In various embodiments, a processor may include an instruction cache configured to store instructions, a data cache configured to store data, an execution pipeline configured to execute instructions retrieved from the instruction cache using data retrieved from the data cache, and a storage array configured to store processor state during execution of instructions. One or more of the instruction cache, the data cache, or the storage array may include an array of bit cells organized according to a number of rows and columns. For a given column, the cache and/or storage array may further include a bit line circuit coupled to the bit cells included in the given column, and a write driver circuit configured to couple write data to the bit line circuit.

For the given column, a boost circuit that is distinct from the write driver circuit may also be included, where the boost circuit may be coupled directly to the bit line circuit of the given column without being coupled to discharge internal capacitance of the write driver circuit, and further may be selectively enabled to drive the bit line circuit of the given column below a ground voltage dependent on both activation of a boost signal corresponding to the given column and the write data for the given column being in a logic low state. During operation of the processor, timing of activation of the boost signal relative to the write data is dynamically variable.

BRIEF DESCRIPTION OF THE DRAWINGS

The above and further advantages of the methods and mechanisms may be better understood by referring to the following description in conjunction with the accompanying drawings, in which:

FIG. 6 is a block diagram illustrating an embodiment of a boost capacitor.

FIGS. 7-8 are block diagrams illustrating embodiments of a boost control circuit.

DETAILED DESCRIPTION OF EMBODIMENTS

Figure 1:
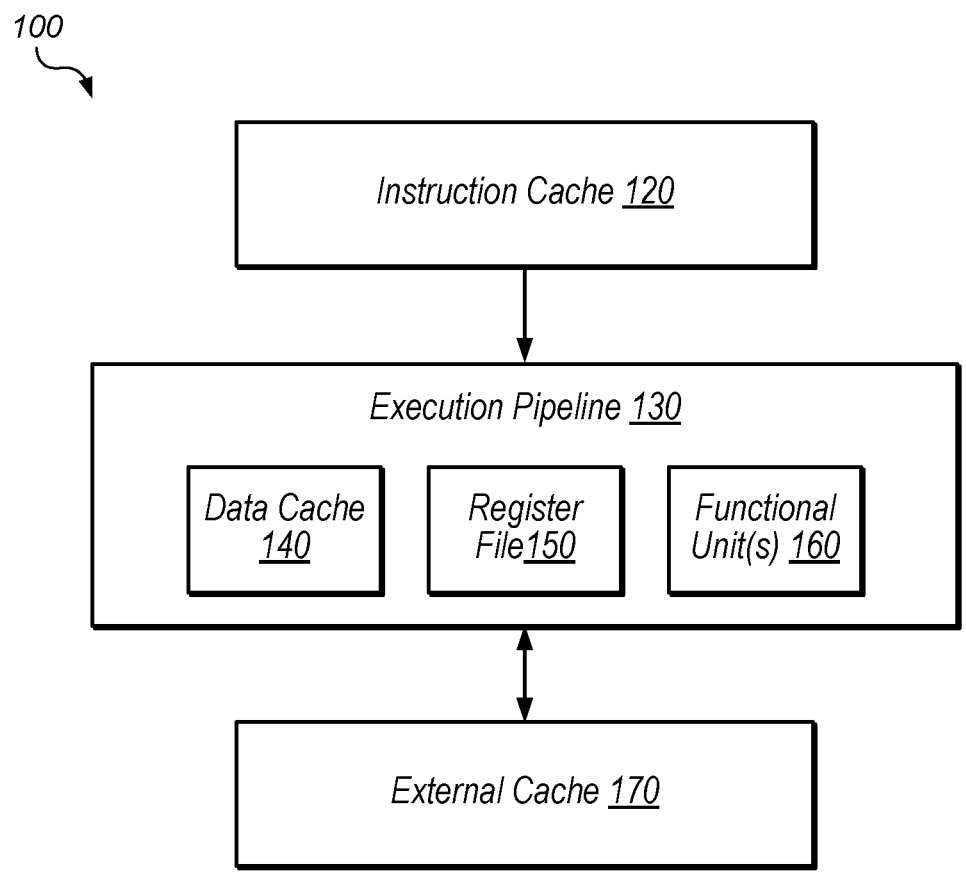
FIG. 1 is a block diagram illustrating an embodiment of an integrated circuit.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described here. It will be appreciated that for simplicity and clarity of illustration, elements shown in the figures have not necessarily been drawn to scale. For example, the dimensions of some of the elements may be exaggerated relative to other elements.

This specification includes references to "an embodiment." The appearance of the phrase "in an embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning "having the potential to"), rather than the mandatory sense (i.e., meaning "must"). Similarly, the words "include," "including," and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a processor . . . ." Such a claim does not foreclose the system from including additional components (e.g., a display, a memory controller).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B. "Dependent on" may be employed as a synonym for "based on."

"In Response To." As used herein, this term is used to describe causality of events or conditions. For example, in the phrase "B occurs in response to A," there is a cause-and-effect relationship in which A causes B to occur. It is noted that this phrase does not entail that A is the only event that causes B to occur; B may also occur in response to other events or conditions that may be independent of or dependent on A. Moreover, this phrase does not foreclose the possibility that other events or conditions may also be required to cause B to occur. For example, in some instances, A alone may be sufficient to cause B to happen, whereas in other instances, A may be a necessary condition, but not a sufficient one (such as in the case that "B occurs in response to A and C").

"Each." With respect to a plurality or set of elements, the term "each" may be used to ascribe some characteristic to all the members of that plurality or set. But absent language to the contrary, use of "each" does not foreclose the possibility that other instances of the element might not include the characteristic. For example, in the phrase "a plurality of widgets, each of which exhibits property A," there must be at least two (and possibly arbitrarily many) widgets that exhibit property A. But without more, this does not foreclose the possibility of an additional widget, not a member of the plurality, that does not exhibit property A. In other words, absent language to the contrary, the term "each" does not refer to every possible instance of an element, but rather every element in a particular plurality or set.

Turning now to FIG. 1, a block diagram of one embodiment of a portion of an integrated circuit 100 is shown. In various embodiments, integrated circuit 100 may correspond to a general-purpose processor, an embedded processor, a graphics processor, a digital signal processor (DSP), or any other type of processor that is generally capable of operating on digital data. In the illustrated embodiment, integrated circuit 100 includes an instruction cache 120 coupled to an execution pipeline 130, which is in turn coupled to an external cache 170. As shown in FIG. 1, execution pipeline 130 further includes a data cache 140, a register file 150, and one or more functional units 160.

As a preliminary matter, it is noted that FIG. 1 is intended to illustrate several components that tend to be common to many digital integrated circuit designs. These components are illustrated at a high level of abstraction in order to facilitate the discussion of more particular features below. It is noted that integrated circuit 100 may include numerous features in addition to those shown, and may be organized in any suitable fashion beyond that shown here.

Instruction cache 120 may generally be configured to store instructions for execution by execution pipeline 130. For example, instruction cache 120 may be configured to fetch instructions from external storage (such as system memory) well in advance of when those instructions are expected to be executed, in order to hide the latency of accessing external storage. In various embodiments, instruction cache 120 may be configured according to any suitable cache architecture (e.g., direct-mapped, set-associative, etc.). Integrated circuit 100 may also include other circuitry related to instruction fetch and issuance, such as instruction decode and/or issue logic, which may be included within instruction cache 120 or elsewhere. In some embodiments, instruction cache 120 or another component of integrated circuit 100 may include branch prediction circuitry, predication circuitry, or other features relating to the conditional or speculative execution of instructions.

Execution pipeline 130 may generally be configured to execute instructions issued from instruction cache 120 to perform various operations. Such instructions may be defined according to an instruction set architecture (ISA), such as the x86 ISA, the PowerPC™ ISA, the Arm™ ISA, or any other suitable architecture.

In the illustrated embodiment, execution pipeline 130 includes data cache 140. Similar to instruction cache 120, data cache 140 may provide temporary storage for data retrieved from another, slower memory within a memory hierarchy. Instructions executed by execution pipeline 130 may access the contents of data cache 140 through explicit load or store instructions, or via other instructions that implicitly reference load/store operations in combination with other operations, depending on the characteristics of the implemented ISA. Data cache 140 may be organized as direct-mapped, set-associative, or according to any other suitable cache geometry, and may implement single or multiple read and write ports.

Register file 150, also an illustrated component of execution pipeline 130, may be configured as architecturally-visible registers and/or registers distinct from those specified by the ISA. For example, an ISA may specify a set of registers (such as a set of 32 64-bit registers denoted R0 through R31, for example) that executable instructions may specify as the source of data operands. However, in order to implement performance-improving schemes such as register renaming, register file 150 may implement a larger number of physical registers than those defined by the ISA, allowing architectural registers to be remapped to physical registers in ways that help resolve certain types of data dependencies between instructions. Accordingly, register file 150 may be substantially larger than the minimum set of architecturally-visible registers defined by the ISA. Moreover, register file 150 may be implemented in a multi-ported fashion in order to support multiple concurrent read and write operations by different, concurrently-executing instructions. In various embodiments, logic to perform register renaming, port scheduling and/or arbitration, or any other aspects relating to the operation of register file 150 may be included within register file 150 itself or within another unit.

Functional unit(s) 160 may be configured to carry out many of the various types of operations specified by a given ISA. For example, functional unit(s) 160 may include combinatorial logic configured to implement various arithmetic and/or logical operations, such as integer or floating-point arithmetic, Boolean operations, shift/rotate operations, address arithmetic for load/store operations, or any other suitable functionality. In some embodiments, execution pipeline 130 may include multiple different functional units 160 that differ in terms of the types of operations they support. For example, execution pipeline 130 may include a floating point unit configured to perform floating-point arithmetic, one or more integer arithmetic/logic units (ALUs) configured to perform integer arithmetic and Boolean functions, a graphics unit configured to implement operations particular to graphics processing algorithms, a load/store unit configured to execute load/store operations, and/or other types of units.

External cache 170 may be configured as an intermediate cache within a memory hierarchy. For example, external cache 170 may be a second-level cache interposed between external system memory and the first-level instruction cache 120 and data cache 140. Although often larger and slower than first-level caches, external cache 170 may nevertheless be substantially faster to access than external random-access memory (RAM), and its inclusion may improve the average latency experience by a typical load or store operation. External cache 170 may be configured according to any suitable cache geometry, which may differ from the geometries employed for instruction cache 120 and/or data cache 140. In some embodiments, still further caches may be interposed between external cache 170 and system memory.

Many of the elements discussed above share the common characteristic that they may include storage arrays that are configured to store substantial quantities of data for subsequent retrieval and use. For example, although their configurations may differ to suit their different roles, each of instruction cache 120, data cache 140, and external cache 170 may be configured to store data on the order of kilobytes, megabytes, or more. Similarly, although register file 150 may have different bandwidth requirements than the various caches, it nevertheless may be implemented as a storage array of the general organization to be discussed shortly. Finally, functional unit(s) 160 may include data structures such as buffers (e.g., load/store buffers) that lend themselves to implementation as storage arrays. It is noted that storage arrays of various configurations may be used throughout integrated circuit 100 to retain various types of processor state not described above.

Figure 2:
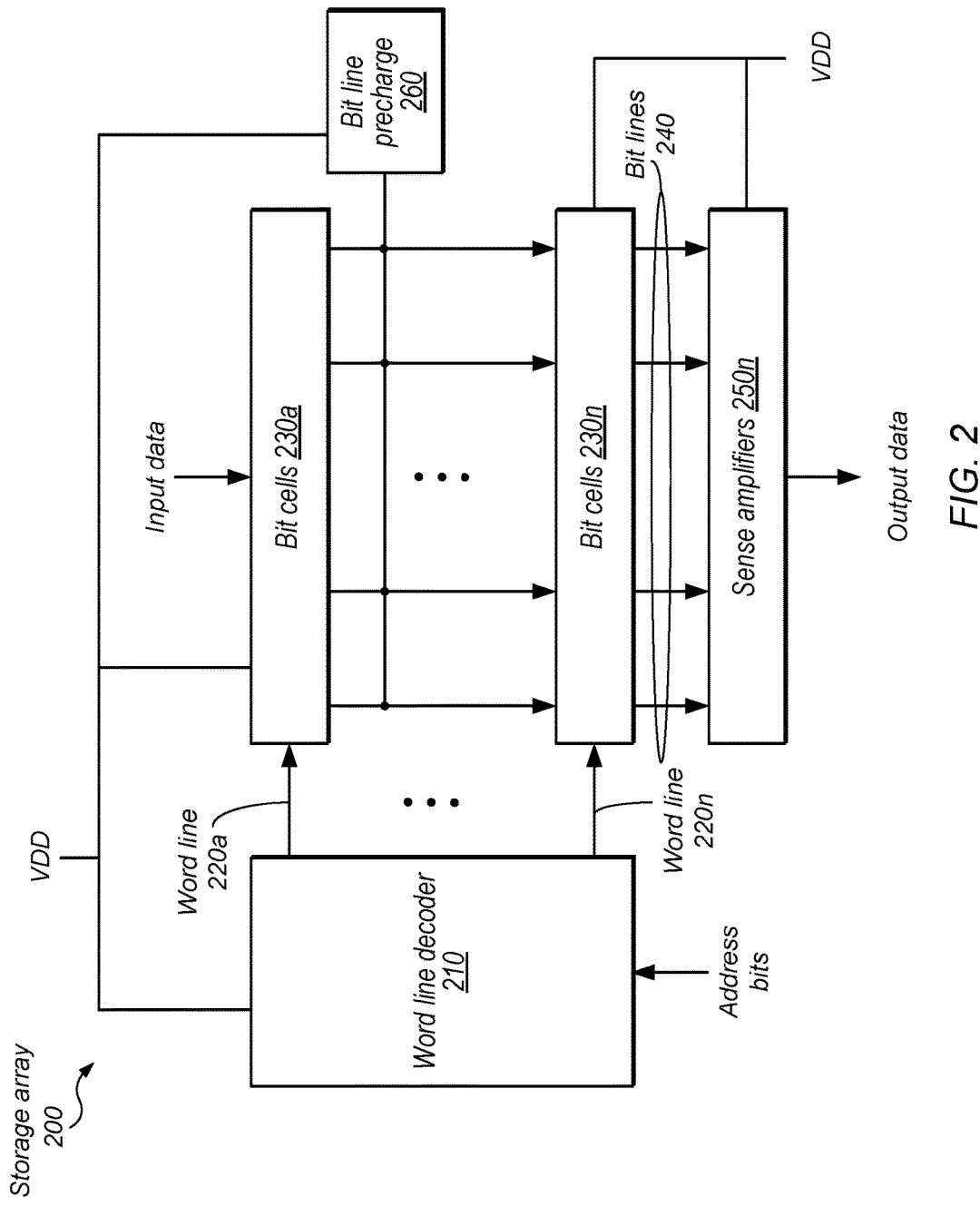
FIG. 2 is a block diagram illustrating an embodiment of a storage array.

FIG. 2 illustrates an embodiment of a storage array 200 that, with suitable modifications, may be used in a variety of ways within integrated circuit 100, including within the types of elements just discussed. In the illustrated embodiment, storage array 200 includes a word line decoder 210 coupled to receive address bits and decode them into a number of word lines 220a-n (referred to collectively or individually simply as word line(s) 220). For example, in an embodiment of storage array 200 that includes 128 word lines 220, seven bits of the memory address for a load or store operation may be decoded to select a particular one of the 128 word lines 220.

Each of word lines 220 may be coupled to a corresponding set of bit cells 230a-n (referred to collectively or individually simply as bit cells 230). Collectively, bit cells 230 are coupled to receive input data, and are also coupled to a set of bit lines 240, which are in turn coupled to a set of sense amplifiers 250 and are also coupled to a bit line precharge circuit 260. Bit cells 230 can be considered to be organized on the basis of rows (e.g., corresponding to word lines 220) and columns (e.g., corresponding to bit lines 240, or pairs of bit lines 240 in embodiments employing differentially-encoded bit lines), such that a given individual bit cell 230 can be identified by the intersection of the row and column within which it resides. Sense amplifiers 250 may provide, as output data, the data stored in the bit cells 230 that are selected by a particular word line 220. It is noted that in some embodiments, storage array 200 may include further elements that process the output data before it is provided as the output of storage array 200 itself. For example, in a set-associative cache, a way selection may be performed on the basis of a tag comparison.

It is noted that the number of word lines 220, bit cells 230, bit lines 240, and sense amplifiers 250 may vary in different embodiments according to factors such as the size of storage array 200 and its performance requirements. Moreover, although the elements of FIG. 2 have been arranged to facilitate a logical discussion of their operation, the physical arrangement of these elements need not necessarily correspond to what is shown.

In some embodiments, each individual one of bit cells 230 may be designed to store a single bit of information. A conventional six-transistor (6T) bit cell implementation may be employed, in which four transistors are arranged as a pair of cross-coupled inverters that form a storage element, the true and complement nodes of which are coupled to true and complement bit lines 240 via two additional transistors under the control of one of word lines 220. However, other configurations may also be employed for bit cells 230, including multi-ported bit cells and bit cells capable of storing multiple bits of information.

As just noted, in some embodiments, each bit cell 230 within a row controlled by a single word line 220 may be coupled to a pair of bit lines 240, such that storage array 200 may include twice as many physical bit lines 240 as bit cells 230 per row. Under the assumption that only one word line 220 is active at a time during a read or write access, a single pair of bit lines 240 may be wired across corresponding bits in each row of bit cells 230. In a multi-ported implementation of storage array 200, a separate pair of bit lines 240 may be provided for each port of bit cells 230. In single-ended embodiments, a single bit line 240 may be used per column, rather than a pair of bit lines.

Because the size of storage array 200 tends to be heavily influenced by the size of individual bit cells 230, there may exist a strong design incentive to keep bit cells 230 compact. However, the smaller the device size employed within bit cells 230, the weaker the ability of each bit cell 230 to develop a voltage differential across a pair of bit lines 240 when the cell is being read. This may be partially compensated for by bit line precharge circuit 260, which precharges each of bit lines 240 (i.e., both true and complement bit lines) to a known voltage prior to performing an array access. But given a small device size and the comparably large capacitance presented by bit lines 240, a bit cell 230 may only be capable of developing a voltage differential of, for example, several tens or hundreds of millivolts across the true and complement pair of bit lines 240 to which it is coupled. Accordingly, sense amplifiers 250 are configured to amplify the small voltage differential present on bit lines 240 during a read operation and convert it to a level that can be used to drive downstream logic. (Although the use of differential signaling across pairs of bit lines 240 has been discussed above, single-ended bit line implementations are possible and contemplated, as previously noted.)

As semiconductor manufacturing process geometries shrink, the supply voltage VDD that drives circuits like storage array 200 may fall. When the supply voltage level is interpreted to signal a logic 1 state and the ground voltage (which may be designated VSS) is interpreted to signal a logic 0 state, a decrease in the supply voltage decreases the absolute voltage differential between these two logic states. For example, when past fabrication process geometries were in the range of 1 micron, supply voltage levels on the order of 3 to 5 volts were typical. By contrast, with current process geometries measuring on the order of tens of nanometers, supply voltage levels on the order of 1 volt or below are not uncommon. That is, the absolute voltage differential between typical binary logic states has effectively narrowed by as much as 80% as deep-submicron manufacturing processes have evolved.

This narrower range may present a variety of design challenges, such as increased noise susceptibility, timing difficulties, and unreliable circuit behavior. One such example may arise in the case of writing data to bit cells 230. Recall first the read case: as noted above, the compact bit cells 230 within storage array 200 may have very limited drive capability, being able to develop only small signals on bit lines 240 (distinguishing the logic 1 and 0 case by perhaps only several hundred millivolts) that need amplification by sense amplifiers 250 to represent the typical logic 1 voltage.

Similarly, writing data to bit cells 230 may become more challenging as VDD decreases. In typical arrays, data is written to a particular bit cell 230 either using the same set of bit lines 230 used for reading data, or via a separate set of bit lines 230 having similar electrical characteristics (e.g., in the case of a multi-ported storage array). Within a given column of storage array 200, the bit lines 240 carrying write data—as well as the individual bit cells 230 coupled to those bit lines 230—present a substantial amount of capacitance. Recalling that capacitance is defined as the ratio of charge (in coulombs) to voltage (in volts), $C=Q/V$, it follows that the larger the capacitance of a given circuit, the greater the amount of charge that must be moved to change the voltage state of that circuit. Moreover, the rate at which that charge can be moved (i.e., the current) is dependent on the voltage that can be developed across that capacitance. Correspondingly, as voltage decreases, the rate at which charge can be moved to or from the capacitance formed by bit cells 230 and bit lines 240 when writing data also decreases. This may increase the overall time required to reliably write a data value into bit cells 230, which may decrease the overall performance of storage array 200.

One technique for improving bit line write performance under reduced supply voltage conditions is to temporarily increase the voltage differential across the bit line beyond the normal operating differential implied by VDD and VSS. This technique, which may also be referred to as "boost," may be implemented by, for example, temporarily decreasing the voltage level of bit line 240 below a ground voltage. By temporarily increasing the voltage differential, using boost may speed the rate at which a bit line may change state. Independently of this rate of change, the development of a wider peak voltage differential across bit lines 240, particularly when using differential bit line pairs, may improve the reliability of writing data into bit cells 230. (Depending on the initial state and final state of the bit line, it may also be possible to perform boost by increasing the voltage level of bit line 240 above the normal VDD supply voltage; in at least some circumstances, this may yield an equivalent functional result when the assumed polarities of the following discussion are inverted.)

Figure 3:
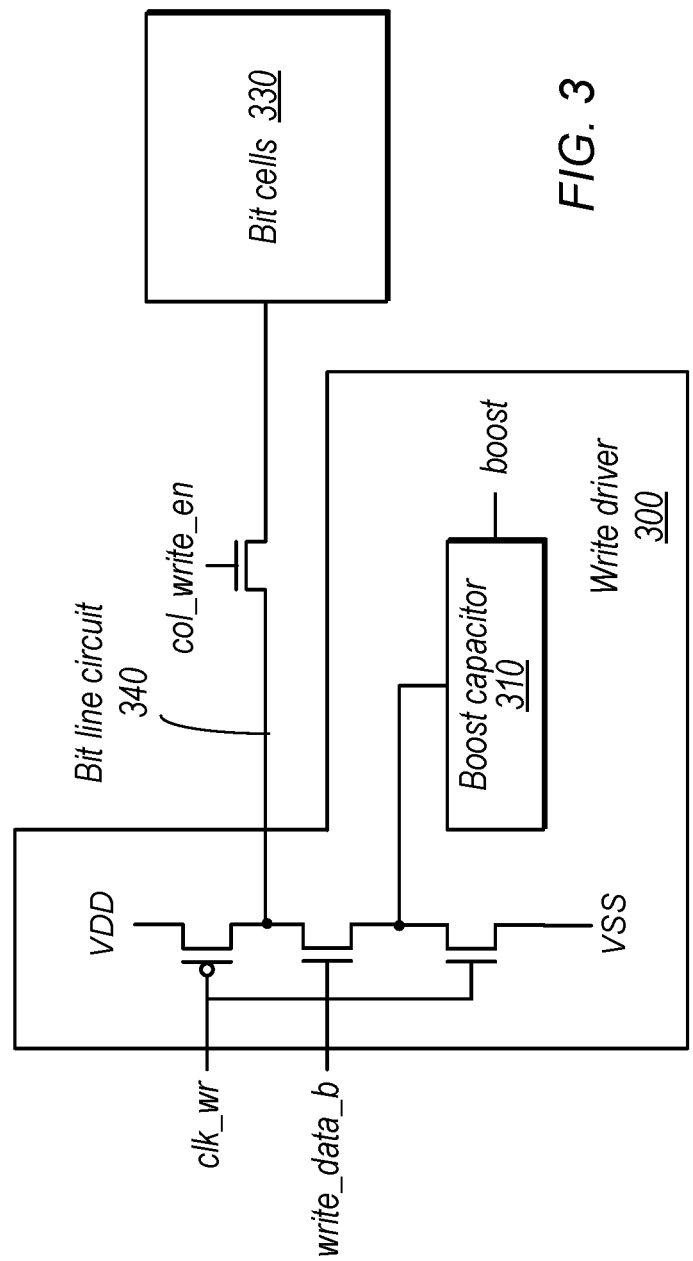
FIG. 3 is a block diagram illustrating an embodiment of a write driver with an integrated boost circuit.

One example of a circuit configured to perform boosting during a bit cell write is shown in FIG. 3. In the illustrated embodiment, a write driver circuit 300 is shown coupled to a bit line circuit 340, which is in turn coupled to bit cells 330. Bit cells 330 and bit line circuit 340 may correspond to those components of a particular column of storage array 200 shown in FIG. 2. Bit line circuit 340 is shown coupled to bit cells 330 via a column write enable device; in some embodiments, a separate read path may couple bit line circuit 340 to a sense amplifier via a distinct enable device, though this is omitted for clarity. (In some embodiments, distinct sets of bit lines may be employed for reading and writing, in which case the read and write enable devices may be omitted.)

As shown, write driver 300 couples an inverted version of the write data (denoted write_data_b) to bit line circuit 340 dependent upon the state of a clocked write signal (denoted clk_wr). Initially, bit line circuit 340 is assumed to be precharged to VDD via a circuit such as bit line precharge circuit 260 of FIG. 2 (omitted in FIG. 3 for simplicity). When clk_wr is in a logic high state, indicating that a write is to be performed, then the state of bit line circuit 340 will depend on the state of write_data_b. If write_data_b is in a logic low state (corresponding to write data that is in a logic high state), then the N-type field effect transistor (NFET) to which write_data_b is coupled will remain off, no discharge path to VSS will be created, and bit line circuit 340 will remain in the precharged state, indicating that a logic high value should be written into a selected one of bit cells 330.

Conversely, if write_data_b is in a logic high state (corresponding to write data that is in a logic low state) then the NFET coupled to write_data_b will be activated, causing bit line circuit 340 to discharge to VSS when clk_wr is in a logic high state for a write operation. The resulting low voltage level on bit line circuit 340 will present a logic low value to be written into a selected one of bit cells 330.

In this example, the low-going transition of bit line circuit 340 is the transition that limits write performance, as the data to be written into bit cells 330 will not be stable until bit line circuit 340 has sufficiently discharged. To speed this discharge, and/or to temporarily increase the voltage differential presented to bit cells 330, write driver 300 includes boost capacitor 310. When activated by assertion of the boost signal, boost capacitor 310 causes the level of bit line circuit 340 to be temporarily pulled below ground, which may improve overall write performance as discussed above.

The write driver configuration of FIG. 3 may present design challenges in terms of device sizing and power requirements. For example, devices within write driver 300 should be able to sink a sizable amount of charge present on bit line circuit 340 when it discharges, and are therefore usually large devices having significant capacitance. When boost capacitor 310 is included within write driver 300 as shown, it needs to be sized not only with respect to the charge that is present on bit line circuit 340, but also with respect to the charge on the other devices within write driver 300. In qualitative terms, incorporating boost capacitor 310 within write driver 300 presents a significant capacitive load to boost capacitor 310, necessitating that it also be sized to be relatively large in order to be able to draw down the accumulated charge on bit line circuit 340 in a timely manner. Generally speaking, large devices consume more semiconductor die area, increasing manufacturing cost, and also consume more power, with the negative thermal and performance consequences that ensue.

Figure 4:
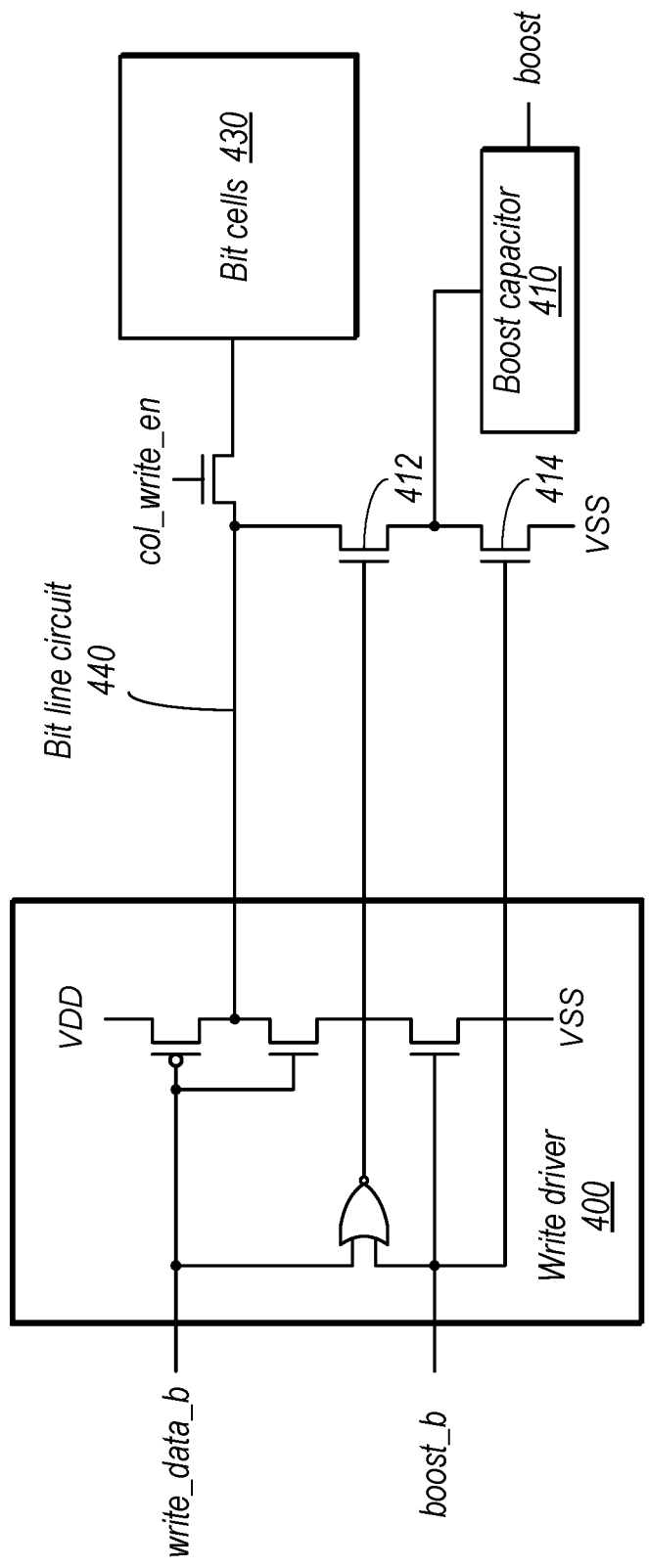
FIG. 4 is a block diagram illustrating a different embodiment of a write driver.

FIG. 4 illustrates an embodiment in which some of the challenges present in the embodiment of FIG. 3 may be at least partially ameliorated. In the illustrated embodiment, a write driver circuit 400 is shown coupled to a bit line circuit 440, which is in turn coupled to convey write data to bit cells 430. Bit cells 430 and bit line circuit 440 may correspond to those components of a particular column of storage array 200 shown in FIG. 2. As in FIG. 3, bit line circuit 440 is shown coupled to bit cells 430 via a column write enable device that may be used to multiplex bit line circuit 440 with read data and may be omitted in some embodiments.

In the illustrated embodiment, boost capacitor 410 is separated from write driver 400 and coupled to bit line circuit 440 at a location that is closer to at least one of bit cells 430 than to write driver 400. Specifically, boost capacitor 410 is selectively coupled to bit line circuit 440 via NFET device 412, and is also selectively coupled to VSS via NFET device 414. As discussed in greater detail below, coupling to VSS via NFET device 414 is optional and may be omitted.

Devices 412 and 414 (if present) are in turn controlled by write driver 400. Specifically, write driver 400 is coupled to receive an inverted version of the write data (denoted write_data_b) as well as an inverted version of a boost signal (denoted boost_b; when the boost signal is considered to be activated while in a logic high state, boost_b is considered to be activated while in a logic low state).

Before proceeding, it is noted that the configuration of FIG. 4 shows only a single bit line within bit line circuit 440. The configuration of FIG. 4 can be easily modified to accommodate embodiments that employ differentially-encoded pairs of bit lines within bit line circuit 440, where the members of the pair have opposite voltage states when active for writing bit cells 430. In one such embodiment, write driver 400 may be duplicated and coupled to receive a write_data signal instead of write_data_b, where write_data has the opposite polarity of the write_data_b signal shown in FIG. 4. The output of this second instance of write driver 400 would then be coupled to drive the second member of the differentially-encoded bit line pair, the first member being the one shown in FIG. 4. Device 412 would also be duplicated and coupled to the second member of the bit line pair, its gate coupled to the NOR logic of the second instance of write driver 400. Although device 414 and/or boost capacitor 410 could be duplicated in some embodiments, this is not necessary, because only one of the two bit lines should discharge on any occasion. As a result, a single instance of device 414 may be coupled to both bit lines of the differentially-encoded pair via respective instances of device 412. During operation, boost capacitor 410 will be coupled to whichever one of the two bit lines is discharging (i.e., transitioning low) via one of the duplicate devices 412.

In the embodiment of FIG. 4, it is assumed that write_data_b is qualified to be valid during a period that both a clock signal input and a write-enable input to storage array 200 are activated. In other words, write_data_b is assumed to be combined with a clock signal and a write-enable signal in a manner that ensures that write_data_b will only reflect a logic high state when the write data is in a logic low state, and when the clock signal and write enable signal indicate that a write is to be performed. The qualification of write_data_b may be performed in any suitable fashion (e.g., using a combinatorial logic gate that combines the write data, clock signal, and write enable signal in the appropriate manner); this logic is omitted for simplicity.

Before a write operation occurs, bit line circuit 440 is assumed to be precharged to a logic high state, write_data_b is initially assumed to be in a logic low state, and the boost signal is assumed to be deactivated (meaning inverted boost_b is in a logic high state). In this state, write driver 400 actively outputs a logic high state onto precharged bit line circuit 440. Moreover, device 414 is active, coupling boost capacitor 410 to VSS. Device 412 is shown to be controlled by the logical NOR of write_data_b and boost_b (or its logical equivalent); under the assumed initial conditions, the logic high state of boost_b causes the output of the NOR to be in a logic low state, deactivating device 412 and isolating boost capacitor 410 from bit line circuit 440.

During a write operation, if a logic high state is to be written into one of bit cells 430, write_data_b will remain in a logic low state, bit line circuit 440 will remain precharged, and there will be no need to activate boost capacitor 410 in this circumstance. However, if a logic low state is to be written, write_data_b will transition to a logic high state, causing bit line circuit 440 to discharge through write driver 400. In the illustrated embodiment, activation of write driver 400 to couple write_data_b to bit line circuit 440 may be dependent on boost_b being deactivated; that is, the operation of write driver 400 may be mutually exclusive with the activation of boost capacitor 410.

So long as write_data_b remains in a logic high state, device 412 will remain inactive. However, when write_data_b returns to an inactive, logic low state and boost_b is driven to its activated, logic low state, several consequences occur: device 414 is inactivated, decoupling boost capacitor 410 from VSS; device 412 is activated, coupling boost capacitor 410 to bit line circuit 440; and boost capacitor 410 itself is activated, causing the voltage level of bit line circuit 440 to be driven below the ground voltage level of VSS. Thus, in this case, the voltage level of bit line circuit 440 is boosted below ground in order to more quickly and/or reliably commit the write data to a particular one of bit cells 440. It is noted that in this embodiment, the coupling of boost capacitor 410 to drive bit line circuit 440 below the ground voltage may be dependent on both activation of boost_b (which is active in a logic low state in this example) and write_data_b being in a logic low state.

As an aside, the specific one of bit cells 430 that is to be written may be determined by which one of word lines 220 is activated during the write operation. That is, the particular bit cell 430 that is written may be determined by activating both a bit line circuit 440 corresponding to a particular column and a word line 220 corresponding to a particular row. The details of word line activation for write operations are not essential to an understanding of the present disclosure, and any suitable techniques may be employed.

Once the boost cycle is complete, boost_b may be driven to its deactivated, logic high state. In the embodiment of FIG. 4, this state transition may have two effects: it may turn off device 414, decoupling boost capacitor 410 from bit line circuit 440. Moreover, it may activate device 412, which may facilitate the discharge of accumulated charge from boost capacitor 410, readying boost capacitor 410 for another cycle of operation. As noted previously, device 412 is optional and may be omitted; in such an embodiment, the accumulated charge on boost capacitor 410 resulting from the boost operation may drain parasitically through the surrounding circuit structures.

Figure 5:
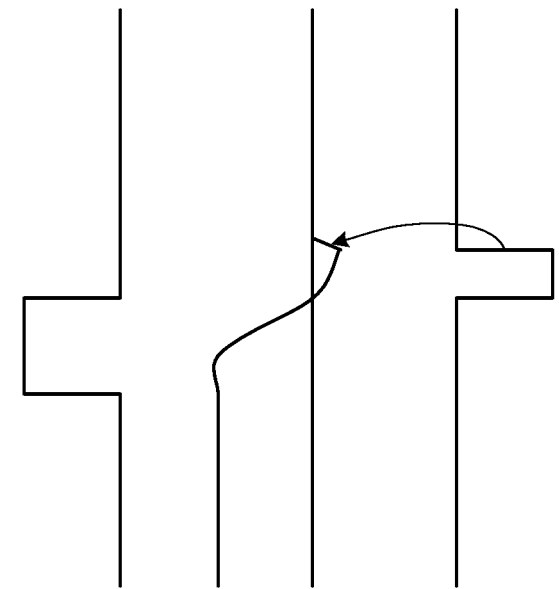
FIG. 5 is a timing diagram illustrating aspects of boost circuit operation.
Figure 5:
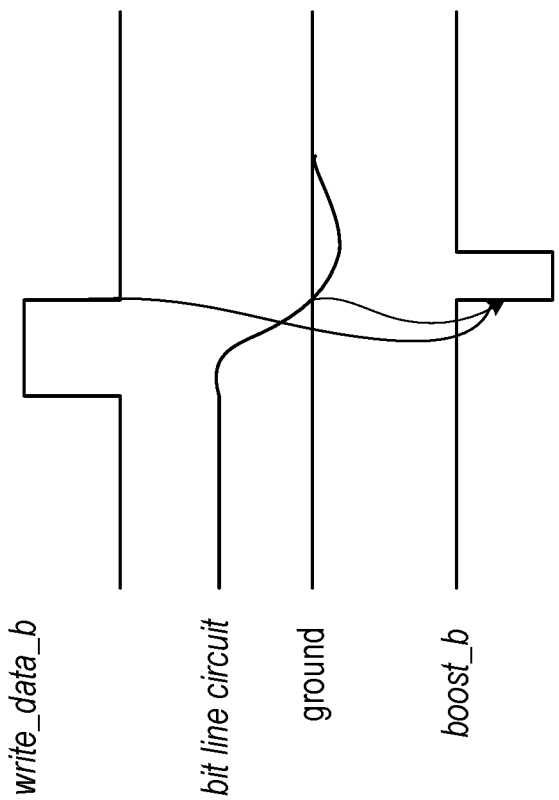

The timing diagrams shown in FIG. 5 illustrate examples of the write operation discussed above. The timing diagram on the left side of FIG. 5 illustrates the behavior of an embodiment that omits optional device 414, whereas the diagram on the right side of FIG. 5 illustrates the possible effect of including device 414. It is noted that the waveform shapes are merely illustrative and not meant to represent the precise behavior of any particular circuit.

Referring first to the left-hand diagram, a high-going transition of write_data_b is shown, illustrating the initiation of a write of a logic 0 to one of bit cells 430. Subsequent to this transition, bit line circuit 430 begins to discharge. When write_data_b returns to a logic low state and boost_b is activated, the voltage level of bit line circuit 440 is pulled below ground. As will be discussed in greater detail below, activation of boost_b may be triggered off of either write_data_b or the state of bit line circuit 440 (as illustrated by the two arrows) and may further be triggered in a time-dependent or voltage-dependent manner.

After boost_b is deactivated, the voltage level on bit line circuit 440 gradually returns to the ground voltage level as the charge stored on boost capacitor 410 dissipates. By contrast, in the right-hand diagram of FIG. 5, deactivation of boost_b may activate device 414, creating a direct discharge path from boost capacitor 410 to VSS. As a result, the voltage level of bit line circuit 440 returns to the ground voltage more quickly than in the case of parasitic discharge. By controlling the timing of the deactivation of boost_b, the timing of the discharge of boost capacitor 410 may also be controlled.

Before proceeding, it is noted that in the configuration of FIG. 4, boost capacitor 410 is not integrated within write driver 400, but is instead a distinct structure that, in the illustrated embodiment, is coupled to bit line circuit 440 at a location that is closer to at least one of bit cells 430 than to write driver 400. It can be seen that boost capacitor 410 is coupled to bit line circuit 440, and thus coupled to discharge the capacitance of bit line circuit 440, without being coupled to discharge internal capacitance of write driver 400. This may allow boost capacitor 410 to be sized to drain charge that is stored on bit line circuit 440 without being sized to drain charge that is stored internally to write driver 400. Because write driver 400 often needs to be sized to drive the significant capacitive load presented by bit line circuit 440 and bit cells 430, write driver 400 typically exhibits a significant degree of internal capacitance (i.e., capacitance not necessarily present at the inputs or outputs of write driver 400) and thus stored charge within its internal devices.

By separating boost capacitor 410 from write driver 400 and placing it closer to bit cells 430, thereby substantially isolating boost capacitor 410 from internal capacitance of write driver 400, it may be possible to significantly reduce the size of boost capacitor 410 relative to configurations in which the boost capacitor is integrated within the write driver (e.g., as shown in FIG. 3). For example, the boost capacitor of FIG. 4 may be reduced in area on the order of 50% relative to the configuration of FIG. 3. In some embodiments, separation of boost capacitor 410 from write driver 400 may also enable write driver 400 itself to be reduced in size (also on the order of 50%), because write driver 400 no longer needs to account for the additional internal capacitance presented by boost capacitor 410. Consequently, arrangements such as that of FIG. 4 and similar embodiments may enable a reduction in size of both write driver 400 and boost capacitor 410, with a concomitant reduction in operating power.

Turning now to FIG. 6, an embodiment of a boost capacitor is shown. Boost capacitor 610, which may be an implementation example of boost capacitor 410, is shown to include one or more transistors coupled as a capacitor. Specifically, the illustrated embodiment shows a p-type field effect transistor (PFET), although in some embodiments an n-type field effect transistor (NFET) or another type of device may be used. The PFET gate is coupled to the bit line circuit (e.g., via device 412 of FIG. 4). The source and drain of the PFET are coupled together and in turn coupled to an active-low version of the boost signal. While the boost_b signal of FIG. 4 might be directly coupled to the source and drain of the PFET, electrical and timing considerations may suggest that the active-low boost signal be generated locally to boost capacitor 610, as shown in FIG. 6. During operation, a low-going transition on the coupled source and drain of the PFET may induce charge movement from the PFET gate via the various parasitic capacitances inherent to the PFET (e.g., gate-source capacitance, gate-drain capacitance, gate-substrate capacitance, and/or source-drain capacitance). Consequently, such a transition on the coupled source and drain of the PFET tends to drain charge from whatever the gate of the PFET is coupled to, such as bit line circuit 440. It is noted that FIG. 6 presents merely one example of boost capacitor 610, and that any suitable type of capacitor may be employed, including capacitors based on passive circuit structures as well as active devices.

As discussed above with respect to FIG. 4, the manner in which the boost_b signal is activated may vary in different embodiments. FIG. 7 illustrates an embodiment of a boost control circuit that may be configured to generate a boost signal in a voltage-dependent fashion. In the illustrated embodiment, boost control circuit 700 includes a voltage detection circuit 710. Voltage detection circuit 710 may be coupled to bit line circuit 440 and configured to detect when the voltage of bit line circuit 440 reaches a particular value. Once the particular value is detected, the boost signal may be activated (e.g., by driving boost_b to a logic low state, or driving its complement to a logic high state).

For example, voltage detection circuit 710 may be configured to detect when bit line circuit 440 reaches the ground voltage during its process of discharging, although depending on the embodiment and the desired manner of activating the boost signal, voltage detection circuit 710 may be configured to detect other voltages. Detection may occur, for example, by sampling the analog voltage level of bit line circuit 440, converting that level to the digital domain, and evaluating the digital representation; alternatively, purely analog techniques may be used to perform the detection. In some embodiments, detection may be performed on the write data that is input to write driver 400 (e.g., write_data_b), although the polarity of this data may differ from that on bit line circuit 440.

As an alternative, the boost signal may be generated in a timing-dependent fashion. One such embodiment is shown in FIG. 8. In the illustrated embodiment, boost control circuit 800 includes several time delay elements 810a-c, it being noted that any number of elements may be employed. Delay elements 810 may be, for example, sequences of different numbers of buffers, inverters, or other circuit structures that each have a different propagation delay from input to output. Either bit line circuit 440 or the write data that is input to write driver 400 (e.g., write_data_b) may be input to boost control circuit 800 and coupled to delay elements 810. One of the delay elements 810 may be selected according to a selection signal (denoted delay_select), for example via a multiplexer or other suitable circuit.

During operation, boost control circuit 800 may be configured to detect a transition of a selected, delayed version of the input signal, in either an edge-sensitive or level-sensitive manner. When the transition is detected, the boost signal may be activated. For example, each of delay elements 810a-c may delay its input by a respective amount A, B, or C. Boost control circuit 800 may be configured to detect a rising or falling edge of write_data_b, and then generate boost_b after a delay of whichever one of A, B, or C is detected, thus providing the ability to adjust the timing of activation of the boost signal relative to the write data. In various embodiments, the delay may be selected as part of a manufacturing test and qualification process dependent on performance testing of integrated circuit 100, and the delay may be fixed prior to deployment (e.g., not intended to be adjusted during operation by the end user of integrated circuit 100). In other embodiments, write performance may be monitored and tested during power-on initialization of integrated circuit 100, or during regular operation, and the particular delay may be dynamically chosen and/or adjusted based on the operating conditions detected under these circumstances.

Figure 9:
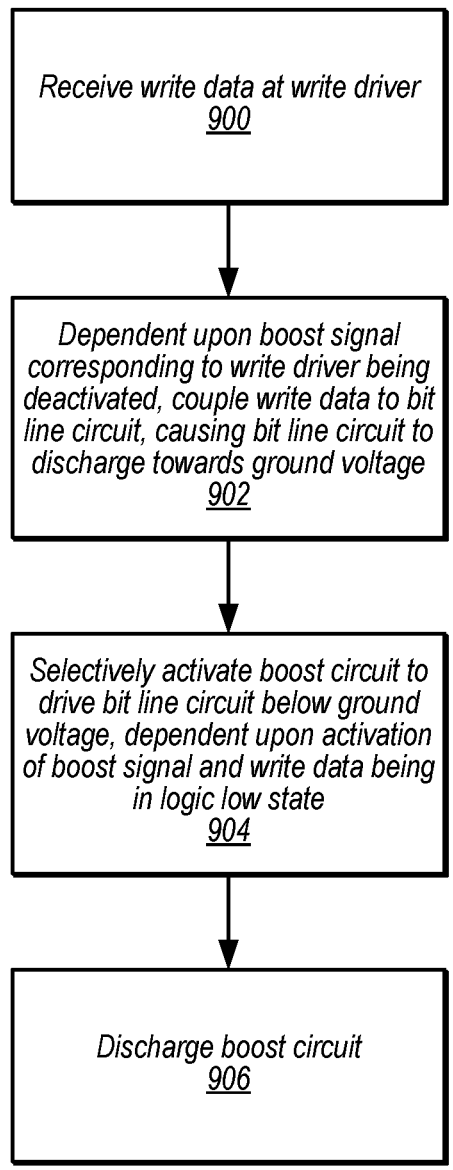
FIG. 9 is a flow diagram illustrating an embodiment of a method of operation of a write driver.

To summarize the foregoing, the flow chart of FIG. 9 illustrates an embodiment of a method of operation of a write driver circuit in conjunction with a boost capacitor, such as the examples illustrated in FIGS. 4-8 and discussed above. Operation begins in block 900 where write data is received at the write driver. For example, the write driver may be associated with a given column of storage array 200. As noted previously, in some embodiments, the write data may be qualified to be valid during a period that both a clock signal input and a write enable signal input to the storage array are activated. That is, the write data may be both clock- and write-qualified.

Dependent upon a boost signal corresponding to the write driver being deactivated, the write data is coupled to a bit line circuit, causing the bit line circuit to discharge towards a ground voltage (block 902). For example, when the write data is in a logic low state, write_data_b may be in a logic high state, which when passed by write driver 400 may cause precharged bit line circuit 440 to begin discharging through write driver 400.

A boost circuit is then selectively activated to drive the bit line circuit below the ground voltage, dependent upon activation of the boost signal and on the write data being in a logic low state (block 904). For example, as discussed above, the boost_b signal may be generated in either a time-dependent or voltage-dependent fashion, based on either the write data that is input to write driver 400, or on the state of bit line circuit 440. In some embodiments, activation of the boost circuit may be mutually exclusive with activation of the boost circuit. Moreover, the timing of the activation of the boost circuit relative to the write data may dynamically vary during operation of the storage array. For example, the timing may vary dependent upon a variable amount of time that it takes for bit line circuit 440 to discharge, as in the case of FIG. 7, or dependent upon a selectable delay period as described with respect to FIG. 8. The boost circuit may be coupled to discharge bit line circuit 440 without being coupled to discharge internal capacitance of write driver circuit 440. Similarly, the boost circuit may be sized to drain charge stored on bit line circuit 440 without being sized to drain charge stored internally to write driver 400.

Subsequent to being activated, the boost circuit discharges (block 906). For example, the boost circuit may discharge parasitically, or it may be selectively coupled to discharge directly to a node at the ground voltage, e.g., based on deactivation of the boost signal.

Figure 10:
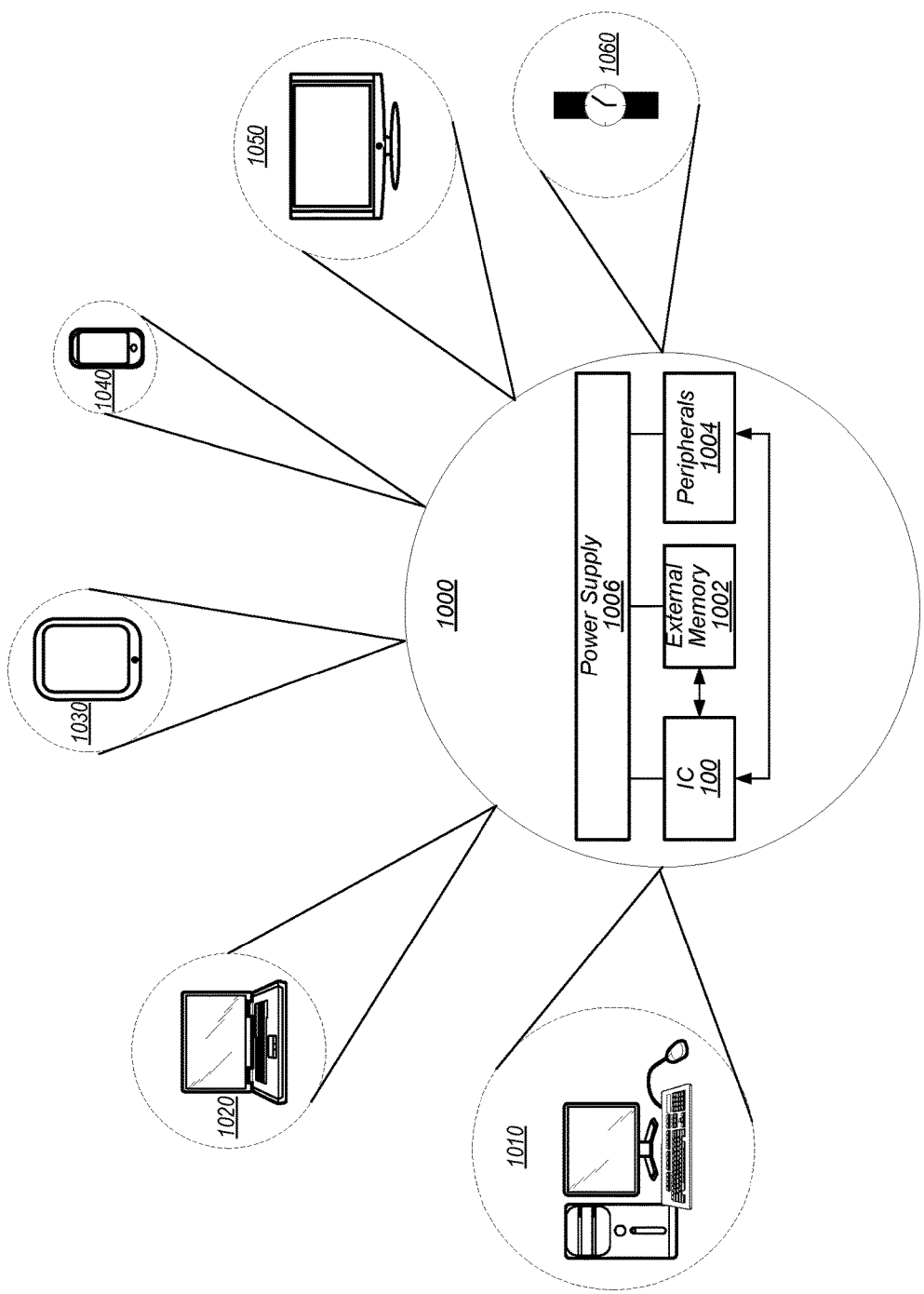
FIG. 10 is a block diagram of an embodiment of a system.

Referring next to FIG. 10, a block diagram of one embodiment of a system 1000 is shown. As shown, system 1000 may represent chip, circuitry, components, etc., of a desktop computer 1010, laptop computer 1020, tablet computer 1030, cell or mobile phone 1040, television 1050 (or set top box configured to be coupled to a television), wrist watch or other wearable item 1060, or otherwise. Other devices are possible and are contemplated. In the illustrated embodiment, the system 1000 includes at least one instance of integrated circuit 100 (of FIG. 1) coupled to an external memory 1002. In various embodiments, integrated circuit 100 may be a processor included within a system on chip (SoC) or larger integrated circuit (IC) which is coupled to external memory 1002, peripherals 1004, and power supply 1006. Integrated circuit 100 may employ any of the circuits or techniques described above with respect to FIGS. 4-9, or variations thereof.

Integrated circuit 100 is coupled to one or more peripherals 1004 and the external memory 1002. A power supply 1006 is also provided which supplies the supply voltages to processor 100 as well as one or more supply voltages to the memory 1002 and/or the peripherals 1004. In various embodiments, power supply 1006 may represent a battery (e.g., a rechargeable battery in a smart phone, laptop or tablet computer). In some embodiments, more than one instance of integrated circuit 100 may be included (and more than one external memory 1002 may be included as well).

The memory 1002 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an SoC or IC containing integrated circuit 100 in a chip-on-chip configuration, a package-on-package configuration, or a multi-chip module configuration.

The peripherals 1004 may include any desired circuitry, depending on the type of system 1000. For example, in one embodiment, peripherals 1004 may include devices for various types of wireless communication, such as wifi, Bluetooth, cellular, global positioning system, etc. The peripherals 1004 may also include additional storage, including RAM storage, solid state storage, or disk storage. The peripherals 1004 may include user interface devices such as a display screen, including touch display screens or multitouch display screens, keyboard or other input devices, microphones, speakers, etc.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A storage array, comprising:
an array of bit cells organized according to a plurality of rows and a plurality of columns;
wherein for a given column of the plurality of columns, the storage array further includes:
a bit line circuit coupled to the bit cells included in the given column;
a write driver circuit configured to couple write data to the bit line circuit,
wherein:
the write data is qualified to be valid during a period that both a clock signal input to the storage array and a write enable signal input to the storage array are activated; and
the write driver circuit is activated to couple the write data to the bit line circuit of the given column dependent upon a boost signal corresponding to the given column being deactivated; and
a boost circuit that is distinct from the write driver circuit, coupled directly to the bit line circuit of the given column without being coupled to discharge internal capacitance of the write driver circuit, and selectively enabled to drive the bit line circuit of the given column below a ground voltage dependent on both activation of the boost signal corresponding to the given column and the write data for the given column being in a logic low state;
wherein:
activation of the write driver to couple the write data to the bit line circuit of the given column is mutually exclusive with activation of the boost circuit to drive the bit line circuit of the given column below the ground voltage; and
during operation of the storage array, timing of activation of the boost signal relative to the write data is dynamically variable.

2. The storage array of claim 1, wherein the boost circuit includes one or more transistors coupled as a capacitor, wherein the capacitor is sized to drain charge stored on the bit line circuit without being sized to drain charge stored internally to the write driver circuit.

3. The storage array of claim 2, wherein subsequent to activation of the boost signal, accumulated charge within the capacitor drains parasitically.

4. The storage array of claim 2, wherein in response to deactivation of the boost signal, the capacitor is selectively coupled to a node at the ground voltage to drain charge accumulated within the capacitor subsequent to activation of the boost signal.

5. The storage array of claim 1, further comprising a boost control circuit that is configured to generate the boost signal, wherein the boost control circuit activates the boost signal dependent upon a voltage level of the write data or the bit line circuit.

6. The storage array of claim 1, further comprising a boost control circuit that is configured to generate the boost signal, wherein the boost control circuit activates the boost signal dependent upon one of a plurality of selectable timing options.

7. The storage array of claim 1, wherein the boost circuit is coupled to the bit line circuit at a location that is closer to at least one bit cell of the given column than to the write driver circuit.

8. The storage array of claim 1, wherein:
the bit line circuit of the given column includes a pair of differentially-encoded bit lines that, when active, transition towards opposite voltages; and
to drive the bit line circuit below the ground voltage, the boost circuit of the given column is configured to drive a low-going one of the pair of differentially-encoded bit lines below the ground voltage.

9. The storage array of claim 1, wherein each column of the plurality of columns includes a respective bit line circuit, a respective write driver circuit, and a respective boost circuit.

10. A processor, comprising:
an instruction cache configured to store instructions;
a data cache configured to store data;
an execution pipeline configured to execute instructions retrieved from the instruction cache using data retrieved from the data cache; and
a storage array configured to store processor state during execution of instructions;
wherein one or more of the instruction cache, the data cache, or the storage array includes an array of bit cells organized according to a plurality of rows and a plurality of columns, and, for a given column of the plurality of columns, further includes:
a bit line circuit coupled to the bit cells included in the given column;
a write driver circuit configured to couple write data to the bit line circuit, wherein:
the write data is qualified to be valid during a period that both a clock signal input to the array and a write enable signal input to the array are activated; and the write driver circuit is activated to couple the write data to the bit line circuit of the given column dependent upon a boost signal corresponding to the given column being deactivated; and a boost circuit that is distinct from the write driver circuit, coupled directly to the bit line circuit of the given column without being coupled to discharge internal capacitance of the write driver circuit, and selectively enabled to drive the bit line circuit of the given column below a ground voltage dependent on both activation of the boost signal corresponding to the given column and the write data for the given column being in a logic low state;

wherein:

activation of the write driver to couple the write data to the bit line circuit of the given column is mutually exclusive with activation of the boost circuit to drive the bit line circuit of the given column below the ground voltage; and during operation, timing of activation of the boost signal relative to the write data is dynamically variable.

11. The processor of claim 10, wherein the boost circuit includes one or more transistors coupled as a capacitor, wherein the capacitor is sized to drain charge stored on the bit line circuit without being sized to drain charge stored internally to the write driver circuit.

12. The processor of claim 10, further comprising a boost control circuit that is configured to generate the boost signal, wherein the boost control circuit activates the boost signal dependent upon a voltage level of the write data or the bit line circuit.

13. The processor of claim 10, further comprising a boost control circuit that is configured to generate the boost signal, wherein the boost control circuit activates the boost signal dependent upon one of a plurality of selectable timing options.

14. The processor of claim 10, wherein the boost circuit is coupled to the bit line circuit at a location that is closer to at least one bit cell of the given column than to the write driver circuit.

15. The processor of claim 10, wherein:

the bit line circuit of the given column includes a pair of differentially-encoded bit lines that, when active, transition towards opposite voltages; and to drive the bit line circuit below the ground voltage, the boost circuit of the given column is configured to drive a low-going one of the pair of differentially-encoded bit lines below the ground voltage.

16. A system, comprising:

a system memory; and at least one processor core configured to execute instructions stored in the system memory;

wherein the at least one processor core includes an array of bit cells organized according to a plurality of rows and a plurality of columns, and, for a given column of the plurality of columns, further includes:

a bit line circuit coupled to the bit cells included in the given column;

a write driver circuit configured to couple write data to the bit line circuit, wherein:

the write data is qualified to be valid during a period that both a clock signal input to the array and a write enable signal input to the array are activated; and the write driver circuit is activated to couple the write data to the bit line circuit of the given column dependent upon a boost signal corresponding to the given column being deactivated; and a boost circuit that is distinct from the write driver circuit, coupled directly to the bit line circuit of the given column without being coupled to discharge internal capacitance of the write driver circuit, and selectively enabled to drive the bit line circuit of the given column below a ground voltage dependent on both activation of the boost signal corresponding to the given column and the write data for the given column being in a logic low state;

wherein:

activation of the write driver to couple the write data to the bit line circuit of the given column is mutually exclusive with activation of the boost circuit to drive the bit line circuit of the given column below the ground voltage; and during operation, timing of activation of the boost signal relative to the write data is dynamically variable.

17. The system of claim 16, wherein the boost circuit includes one or more transistors coupled as a capacitor, wherein the capacitor is sized to drain charge stored on the bit line circuit without being sized to drain charge stored internally to the write driver circuit.

18. The system of claim 16, further comprising a boost control circuit that is configured to generate the boost signal, wherein the boost control circuit activates the boost signal dependent upon a voltage level of the write data or the bit line circuit.

19. The system of claim 16, further comprising a boost control circuit that is configured to generate the boost signal, wherein the boost control circuit activates the boost signal dependent upon one of a plurality of selectable timing options.

20. The system of claim 16, wherein the boost circuit is coupled to the bit line circuit at a location that is closer to at least one bit cell of the given column than to the write driver circuit.

* * * * *